United States Patent

Ward

Patent Number: 5,520,784
Date of Patent: May 28, 1996

[54] ULTRASONIC ENHANCEMENT OF ALUMINUM STEP COVERAGE AND APPARATUS

[75] Inventor: Michael G. Ward, Nyack, N.Y.

[73] Assignees: Sony Corporation, Tokyo, Japan; Materials Research Corporation, Orangeburg, N.Y.

[21] Appl. No.: 455,636

[22] Filed: May 31, 1995

Related U.S. Application Data

[63] Continuation of Ser. No. 79,438, Jun. 17, 1993, abandoned.

[51] Int. Cl.⁶ .................................................. C23C 14/34
[52] U.S. Cl. .............................. 204/192.15; 204/192.17; 204/298.09; 204/298.15; 204/298.29
[58] Field of Search ........................ 204/192.12, 192.17, 204/192.15, 192.3, 192.32, 298.03, 298.06, 298.09, 298.15, 298.23, 298.29

[56] References Cited

U.S. PATENT DOCUMENTS

| | | | |
|---|---|---|---|
| 4,384,918 | 5/1983 | Abe | 204/298.15 X |
| 4,388,517 | 6/1983 | Schulte et al. | 219/121 LJ |
| 4,473,455 | 9/1984 | Dean et al. | 204/298.15 |
| 4,521,286 | 6/1985 | Horwitz | 204/192 E |
| 4,661,228 | 4/1987 | Mintz | 204/192.25 |
| 4,721,689 | 1/1988 | Chaloux, Jr. et al. | 437/189 |
| 4,791,074 | 12/1988 | Tsunashima et al. | 437/160 |
| 4,883,574 | 11/1989 | dos Santos Pereina Ribeiro | 204/192.15 |
| 4,891,112 | 1/1990 | Wong | 204/192.3 |
| 4,897,171 | 1/1990 | Ohmi | 204/298.15 |
| 4,970,176 | 11/1990 | Tracy et al. | 437/187 |
| 4,994,162 | 2/1991 | Armstrong et al. | 204/192.12 X |
| 4,999,096 | 3/1991 | Nihei et al. | 204/192.3 |
| 5,057,185 | 10/1991 | Thomas et al. | 156/643 |
| 5,171,412 | 12/1992 | Talieh et al. | 204/192.15 |

FOREIGN PATENT DOCUMENTS

| | | | |
|---|---|---|---|
| 0153265 | 6/1988 | Japan | 204/298.29 |
| 0062461 | 3/1989 | Japan | 204/298.29 |

*Primary Examiner*—Nam Nguyen
*Attorney, Agent, or Firm*—Wood, Herron & Evans

[57] ABSTRACT

A method and apparatus for sputter depositing aluminum onto a semiconductor substrate to fill micron and submicron vias utilizes ultrasonic energy to ensure adequate filling of the vias. The semiconductor is supported on a block and heated and subjected to ultrasonic energy greater than 25 kHz as aluminum is sputter deposited onto the substrate surface. The frequency of the ultrasonic energy is varied from 35 to 42 kHz as the aluminum is deposited in order to avoid standing wave or node formation along the substrate surface. This permits for an efficient high quality application of aluminum and filling of vias on a semiconductor substrate.

10 Claims, 1 Drawing Sheet

ULTRASONIC ENHANCEMENT OF ALUMINUM STEP COVERAGE AND APPARATUS

This application is a continuation of application Ser. No. 08/079,438 filed Jun. 17, 1993, entitled ULTRASONIC ENHANCEMENT OF ALUMINUM STEP COVERAGE AND APPARATUS, now abandoned.

BACKGROUND OF THE INVENTION

The active switching elements of integrated circuits are interconnected by metal lines deposited by various methods such as physical vapor deposition, chemical vapor deposition, and evaporation. Typically, several levels of metal lines are used in an integrated circuit to allow crossovers. At certain locations, electrical contact is made between lines at different levels. Such contacts are called vias. The drive of integrated circuits to submicron geometry has resulted in vias and contacts of extreme aspect ratio and size. Filling submicron vias and contacts with a conducting metal is extremely difficult. If extreme care is not taken, voids will remain and the wafer must be discarded.

Aluminum thin film metallization is the primary material for conductor of metallization on large scale integrated (LSI) and very large scale integrated (VLSI) circuits. Manufacturers of these devices require the interlevel contact of a metal layer and the silicon layer beneath a dielectric. In addition, interconnects between metal layers separated by a dielectric may be necessary. To reach this end, the conductor metallization must cover vertical or near vertical surfaces in addition to the circuit areas of the substrate. Providing adequate material within the interconnect measured as step coverage, can become difficult depending on the aspect ratio, vertical wall angle, and thin film deposition technique. Physical vapor deposition primarily as evaporation or sputtering, is a method must commonly employed for aluminum deposition. The drawback of these line of site deposition techniques is the self-shadowing effect when any appreciable amount of material has been deposited. The self-shadowing limits step coverage and introduces defects into the interconnect metallization.

Various methods have been proposed for filling interconnecting vias and contacts with aluminum. Surface diffusion is used to move sputter deposited aluminum into vias at temperatures of approximately 450° C. This is disclosed for example in Armstrong et al U.S. Pat. No. 4,994,162. This uses a low temperature seed layer providing a continuous high quality diffusion path for subsequently deposited material to diffuse along. A high temperature, low deposition rate step to allow efficient surface diffusion into the feature is employed followed by a high temperature, high deposition rate step to complete the deposition. Bulk diffusion as a mechanism for via filling has also been proposed by Sugano et al in 1992 VMIC Conference Proceedings "Quarter micron whole filling with SiN sidewalls by aluminum high temperature sputtering." With the Sugano process, the driving fierce for via filling is the interface between a titanium surface layer and the deposited aluminum. The process requires the presence of a continuous and high quality titanium surface on the sidewall of a via.

Further, Tracy U.S. Pat. No. 4,970,176 discloses a deposition of a relatively thick layer of aluminum at a first temperature and a subsequent deposition of a thin layer of aluminum at a high temperature. The specification indicates that the temperature increase acts to reflow the aluminum through grain growth and recrystallization.

In addition to elevated substrate temperature, other techniques available to improve aluminum step coverage include bias deposition, collimation, and chemical vapor deposition. Each technique necessitates a compromise in processing and final film properties. Higher substrate temperatures and bias provide the driving force for aluminum mobility through thermal activation and physical resputtering respectively. However, film properties such as grain size, reflectivity, alloy precipitation and resistivity are significantly altered.

The use of barrier layers between the aluminum and silicon may also be necessary to limit the aluminum silicon reaction at temperatures above 450° C. The use of titanium or titanium nitride layers underneath the aluminum will enhance surface mobility of the aluminum and elevated substrate temperatures. Any significant reaction between the aluminum and titanium, however, will significantly raise the film resistivity.

Collimation of the sputtered aluminum will reduce the deposition rate to 10–20% of the noncollimated and provide significant step coverage improvements at the bottom of the interconnect only. Finally, chemical vapor deposition of aluminum films free of contamination with the necessary silicon and copper dopants is very difficult.

SUMMARY OF THE INVENTION

The present invention is premised on the realization that aluminum metal can be deposited onto substrates and the mobility enhanced through the application of ultrasonic energy. The present invention is further premised on the realization that such ultrasonic energy enhanced mobility can be accomplished at temperatures significantly lower than those usually necessary for thermal energy mobility enhancement alone.

According to the present invention, a semiconductor substrate is clamped to a block containing an ultrasonic wave generator capable of scanning a frequency range from 38 kHz to about 42 kHz. Aluminum is sputter deposited as moderate heat is applied either through radiation lamps or through the block.

In a preferred embodiment, the present invention is a multi-step process which includes an initial aluminum deposition typically around 2000 angstroms at a substrate temperature of 100° to 300° C. During a second aluminum deposit, ultrasonic energy is applied to the substrate along with a concurrent application of substrate heating typically from 350° to 500° C. The sputter deposition of material continues during the application of ultrasonic energy, but may be at a lower rate to allow time for the material to move into features of the wafer. This continues until the desired aluminum film thickness is achieved.

The objects and advantages of the present invention will be further appreciated in light of the following detailed description and drawings in which:

DETAILED DESCRIPTION

The present invention is a method of filling vias and contacts in a semi-conductor wafer or substrate. It is particularly beneficial for filling vias and contacts having submicron diameters where the aspect ratio, that is the height to diameter ratio, is from 1 to about 4. In practicing the present invention, vias and contacts having diameters of 1 to about 0.1 microns and generally 1 to about 0.3 microns can be filled. For purposes of the present invention, vias and contacts will be collectively referred to simply as vias.

The present invention is basically a three step process. In the initial step, aluminum or an aluminum alloy will be deposited at a relatively low temperature. In the second step, the water will be clamped to a block which includes an apparatus to generate ultrasonic energy transmitted through the clamped wafer. Then, in a concurrent step, the ultrasonic energy will be applied at the same time the wafer or substrate is heated and aluminum is deposited.

The via containing substrates which can be coated in the present invention include silicon substrates, boron trifluoride doped silica substrates, quartz substrates, and gallium arsenide substrates. The aluminum layer can be 100% aluminum or more preferably an aluminum alloy such as aluminum silicon (1%), copper (0.5%), aluminum-copper (1%), and aluminum-titanium (0.15%).

Figure 1:
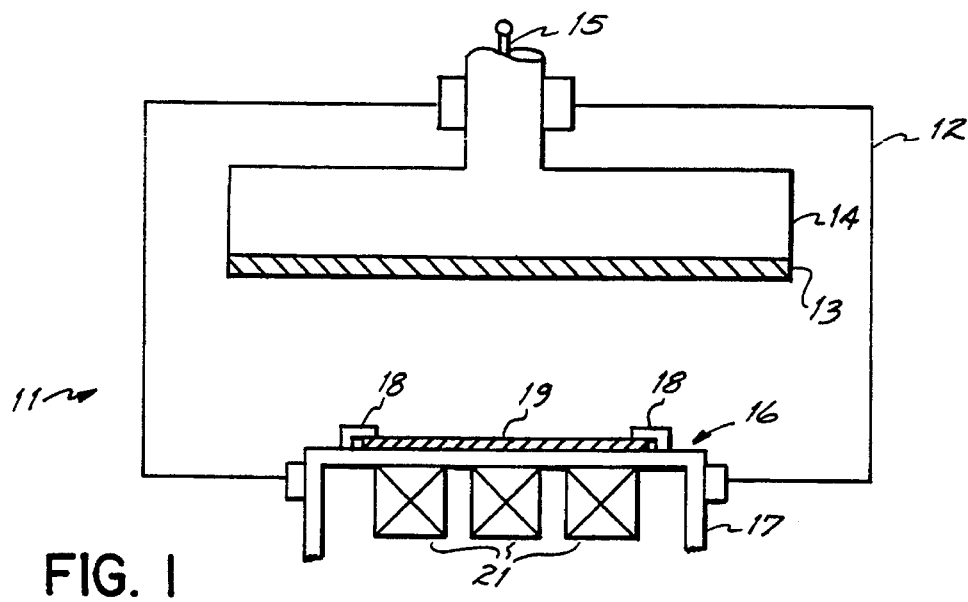
FIG. 1 is a cross-sectional diagrammatic depiction of the apparatus used in the present invention.

As shown diagrammatically in FIG. 1, the present invention is a modified sputtering system 11 which includes a chamber 12 which is a grounded vacuum tight enclosure. The chamber is connected to a vacuum system (not shown) which can reduce the pressure to the desired levels typically down to $1 \times 10^{-8}$ torr or lower prior to sputtering.

Within the chamber is the aluminum sputtering target 13 which is attached to the cathode 14 which in turn is attached to the negative terminal 15 of a DC power supply. The positive terminal of the power supply is grounded. Argon is introduced into the chamber and power is applied to the target to carry out the sputter deposition.

Figure 2:
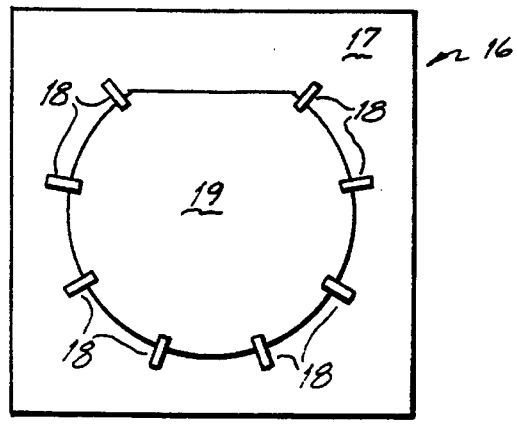
FIG. 2 is an overhead view of the water holding mechanism used in the apparatus shown in FIG. 1.
Figure 3:
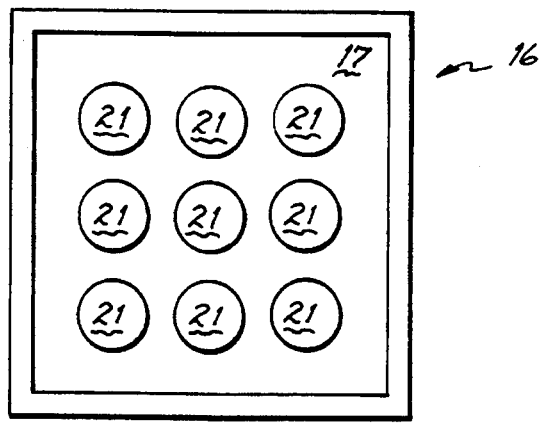
FIG. 3 is a bottom view of the wafer holding mechanism used in the apparatus shown in FIG. 1.

Below the target is the anode substrate holder 16. As shown more particularly in FIG. 2 and FIG. 3, this includes a block 17 which supports a series of clamps 18 to hold the substrate 19. Beneath the block 17 is an apparatus adapted to provide ultrasonic energy through the block and ultimately apply it to the substrate. As shown in this FIG. 3, the mechanism is a series ultrasonic transducers 21 (nine shown) physically attached to the bottom side of the block 17.

More particularly, the source of ultrasonic energy must provide from 38 kHz tip to about 42 kHz frequency against the backside of the wafer. The source of ultrasonic energy must be modulated across the wafer during deposition to avoid node formation. Suitable transducers, for example, can be purchased from Ultrasonic Corporation.

Alternately, the mounting mechanism for the wafer can be modified to employ other clamping mechanisms such as an electrostatic clamping mechanism.

Preferably, the multi-stepped deposition of the present invention is conducted in a multi-chambered sputtering unit which would include an etching chamber and at least three sputtering chambers. One of the sputtering chambers would incorporate the features shown in FIG. 1. Multiple chamber sputtering apparatuses are known. One for example is the Eclipse brand sputtering system sold by Materials Research Corporation, also referred to in U.S. Pat. No. 4,994,162. Other commercially available systems are equally suited.

In the first chamber, the substrate or water is initially etched with argon gas to remove surface impurities. Heating the substrate also assists in removal of outgases. This is optional, but is preferred.

The substrate is then transferred to a second chamber where a barrier layer can be applied if desired. A preferred barrier layer is titanium nitride, although zirconium nitrite, ruthenium oxide barrier layers as well as titanium tungsten layers can be utilized. Generally the thickness of the barrier layer will be about 1000 angstroms. The initial aluminum alloy is applied in the third chamber. As indicated, this should be conducted at 100° to 300° C. with about 100° C. preferred. Generally about 1500 angstroms of the initial aluminum layer will be deposited. This is conducted without the application of ultrasonic energy.

In the final wafer or substrate onto the block and clamping it in position. In an initial deposition, 1000 to 3000 angstroms of aluminum or aluminum alloy will be deposited at 100° to 300° C. at a deposition rate of 150 to 250 angstroms per second. In a second step, the ultrasonic energy will be applied starting at 38 kHz and varying this up to about 42 kHz 100–300 times per second. At this time, either by heating the block or by utilizing a heating lamp, the substrate is heated to 300° to 450° C. while at the same time aluminum is deposited at a rate of 50 to 200 angstroms per second until 3000 to 8000 angstroms of aluminum film is deposited.

Using this method, the vias are effectively filled without permitting gaps or other incontinuities in the vias and surface substrate which could cause a malfunction of the water. Further, because the temperature of this system operates preferably at less than 450° C., the negative film effects caused by the higher temperatures are avoided. This provides a reliable and efficient method of filling vias with aluminum. Due to the application of the ultrasonic energy, excessive time and temperature are not required. Thus, quality is not sacrificed in order to provide adequate via coverage.

The preceding has been a description of the present invention along with the preferred method currently known of practicing the present invention. However, the invention should only be defined by the appended claims wherein I claim:

1. A method of filling vias in a semiconductor substrate comprising:

sputter depositing a film of conductive material over a first surface of said semiconductor and covering said vias;

concurrently applying ultrasonic energy at a repetitiously modulating frequency to a second surface of said substrate as conductive material is sputter deposited onto said first surface.

2. The method claimed in claim 1 wherein said ultrasonic energy is applied at a frequency greater than 25 kHz, 3. The method claimed in claim 2 wherein the frequency of said ultrasonic energy is modulated from about 38 kHz up to about 42 kHz 100–300 times per second.

4. The method claimed in claim 1 comprising initially depositing a first layer of 1000 to 3000 angstroms of aluminum over said first surface without the application of ultrasonic energy and subsequently applying second layer of 3000 to 8000 angstroms of aluminum over said first surface with the application of ultrasonic energy.

5. The method claimed in claim 4 wherein said first layer is applied at a temperature of 100° to 300° C., and said second layer is applied at a temperature of 350° to 500° C.

6. The method of filling vias in a semiconductor substrate comprising:

sputter depositing 1000 to 3000 angstroms of aluminum over the surface of said substrate covering said via without the application of ultrasonic energy at a temperature of 100° to 300° C.;

applying 3000 to 8000 angstroms of aluminum over the surface of said substrate and over said vias at a temperature of 350° to 500° C. while applying ultrasonic energy to said substrate at a frequency of 38 to 42 kHz while modulating said frequency 100 to 300 times per second.

7. An apparatus for sputter depositing conductive material onto a semiconductor comprising a semiconductor support;

means to sputter deposit conductive material onto a semiconductor supported on said support;

means to clamp said semiconductor to said support;

means to apply repetitiously modulated frequency ultrasonic energy to a semiconductor supported and clamped on said support as conductive material is deposited from said means to sputter conductive material onto said semiconductor.

8. The apparatus claimed in claim 7 wherein said support comprises:

a block and wherein a plurality of ultrasonic transducers are affixed to a bottom surface of said block.

9. The apparatus claimed in claim 8 wherein said means to clamp said water to said support comprises a bracket adapted to fix said semiconductor to said block.

10. The apparatus claimed in claim 8 wherein said means to clamp said wafer to said support comprises an electrostatic holder.

* * * * *

UNITED STATES PATENT AND TRADEMARK OFFICE
CERTIFICATE OF CORRECTION

PATENT NO. : 5,520,784
DATED : May 28, 1996
INVENTOR(S) : Ward

It is certified that error appears in the above-indentified patent and that said Letters Patent is hereby corrected as shown below:

In column 1, line 37, please delete the word "must" and insert the word --most--.

In column 1, line 58, please delete the word "fierce" and insert the word --force--.

In column 2, line 60, please delete the word "water" and insert the word --wafer--.

In column 3, line 10, please delete the word "water" and insert the word --wafer--.

In column 3, line 44, please delete the word "tip" and insert the word --up--.

UNITED STATES PATENT AND TRADEMARK OFFICE
CERTIFICATE OF CORRECTION

PATENT NO. : 5,520,784
DATED : May 28, 1996
INVENTOR(S) : Ward

It is certified that error appears in the above-indentified patent and that said Letters Patent is hereby corrected as shown below:

In column 3, line 62, please delete the word "water" and insert the word --wafer--.

In column 4, line 10, after the word "final" insert the following --chamber, processing continues by moving the--.

In column 4, line 23, please delete the word "water" and insert the word --wafer--.

In column 4, line 54, before "second layer, insert the word --a--.

In column 6, line 8, please delete the word "water" and insert the word --wafer--.

Signed and Sealed this

Twelfth Day of November, 1996

*Attest:*

BRUCE LEHMAN

*Attesting Officer*     *Commissioner of Patents and Trademarks*